(12) United States Patent
Clements et al.

(10) Patent No.: US 7,685,674 B2
(45) Date of Patent: Mar. 30, 2010

(54) EXHAUST GAS TREATMENT

(75) Inventors: Christopher James Philip Clements, Burnham on Sea (GB); Ian Richard Whitaker, Wellington (GB)

(73) Assignee: Edwards Limited, Crawley, West Sussex (GB)

( * ) Notice: Subject to any disclaimer, the term of this patent is extended or adjusted under 35 U.S.C. 154(b) by 314 days.

(21) Appl. No.: 10/578,802

(22) PCT Filed: Nov. 12, 2004

(86) PCT No.: PCT/GB2004/004768
§ 371 (c)(1),
(2), (4) Date: Jan. 8, 2007

(87) PCT Pub. No.: WO2005/049240
PCT Pub. Date: Jun. 2, 2005

(65) Prior Publication Data
US 2007/0214599 A1    Sep. 20, 2007

(30) Foreign Application Priority Data
Nov. 17, 2003   (GB) ................. 0326707.7

(51) Int. Cl.
| B08B 1/00  | (2006.01) |
| B08B 7/00  | (2006.01) |
| B08B 9/00  | (2006.01) |
| B08B 9/02  | (2006.01) |
| F16L 45/00 | (2006.01) |
| F16L 55/00 | (2006.01) |
| F23J 3/00  | (2006.01) |
| B01D 45/18 | (2006.01) |
| B01D 46/04 | (2006.01) |
| B01D 46/42 | (2006.01) |
| B01D 50/00 | (2006.01) |
| B01D 51/00 | (2006.01) |

(52) U.S. Cl. ................. 15/406; 15/104.16; 15/104.068; 55/431; 55/428.1; 96/376

(58) Field of Classification Search .......... 15/405–407, 15/104.16, 104.068; 55/431–433, 423, 428.1; 96/376
See application file for complete search history.

(56) References Cited

U.S. PATENT DOCUMENTS
4,986,347 A * 1/1991 Hirth et al. .................... 165/94
(Continued)

FOREIGN PATENT DOCUMENTS
EP     1 391 680 A1    2/2004
(Continued)

OTHER PUBLICATIONS
Kalinin VV, Mirnyi AP, Olberg VP, Vedernikov V YA, Yarygin VN; Abstract of RU2181637 entitled Device for Cleaning Inner Surfaces of Pipes; Apr. 27, 2002; Lukoil-W Sibe Co Ltd; WPI abstract accession No: 2002-401521 [43].
(Continued)

*Primary Examiner*—Bryan R Muller
(74) *Attorney, Agent, or Firm*—Mary K. Nicholes; Ting-Mao Chao

(57) ABSTRACT

An attachment (10) for an inlet pipe (14) to a wet scrubber or other device comprises a sleeve (16) having an open end (18) adapted to be detachably connected to a flanged end (12) of the inlet pipe (14). A shaft (30) is moveable within the sleeve (16), and a scraper (34) is attached to one end of the shaft (30). The shaft (30) forms part of a pneumatic cylinder (40) attached to the other end of the sleeve (16). In use, the shaft (30) is reciprocally moved to cause the scraper (34) to dislodge particulates deposited within the pipe (14). Heated gas such as nitrogen or dry air is injected into the sleeve (16) to prevent scrubbing liquid from condensing within the sleeve (16) and thus inhibit particulate deposition therein.

14 Claims, 3 Drawing Sheets

U.S. PATENT DOCUMENTS

| | | | |
|---|---|---|---|
| 5,659,915 A * | 8/1997 | Dhingra et al. | 15/104.095 |
| 5,935,283 A * | 8/1999 | Sweeney et al. | 55/431 |
| 5,966,767 A * | 10/1999 | Lu et al. | 15/104.05 |
| 6,090,183 A * | 7/2000 | Awaji | 95/35 |
| 6,090,208 A | 7/2000 | Han | |
| 6,263,535 B1 * | 7/2001 | Wang | 15/104.16 |
| 6,676,767 B2 * | 1/2004 | Chang et al. | 134/8 |
| 2003/0217763 A1 | 11/2003 | Chang et al. | |

FOREIGN PATENT DOCUMENTS

| | | |
|---|---|---|
| GB | 1 123 741 | 8/1968 |
| GB | 2 030 672 A | 4/1980 |
| GB | 2 342 372 A | 4/2000 |
| GB | 2342372 A * | 4/2000 |
| WO | WO 91/03328 | 3/1991 |

OTHER PUBLICATIONS

Toho Titanium Co Ltd; Abstract of JP2004057965 entitled Deposit Scraping Apparatus for Use in Reactor for Manufacturing Metallic Salt Compound, has drive Shaft and bit Enabled by Gate Valve and Ground Seal to be Moved in Forward and Backward Direction; Feb. 26, 2004; WPI abstract accession No: 2004-186294 [18].

United Kingdom Search Report of Application No. GB 0326707.7; Date of Search: Apr. 23, 2004.

PCT Notification of Transmittal of the International Search Report and the Written Opinion of the International Searching Authority, or the Declaration; Date of mailing: Mar. 8, 2005.

PCT International Search Report of International Application No. PCT/GB2004/004768; Date of mailing of the International Search Report: Mar. 8, 2005.

PCT Written Opinion of the International Searching Authority of International Application No. PCT/GB2004/004768; Date of mailing: Mar. 8, 2005.

SMC Corporation of America; Rotary Clamp Cylinders product data sheets regarding pneumatic cylinders with rotating shafts; pp. 4.1-1 thru 4.1-22.

E&E Special Products; Mini-Powered Rota-Shafts product data sheets regarding pneumatic cylinders with rotating shafts; pp. A-30 thru A-33.

* cited by examiner

EXHAUST GAS TREATMENT

FIELD OF THE INVENTION

The present invention relates to apparatus for and a method of preventing pipe work from becoming blocked. The invention finds particular application in reducing clogging of the inlet of a wet scrubber or other device used in the semiconductor or flat panel display industry.

BACKGROUND OF THE INVENTION

Many semiconductor processes use or generate solid, condensable or subliming compounds. For example, low-pressure chemical vapour deposition silicon nitride (LPCVD nitride) processes tend use silanes (such as disilane or trisilane) and ammonia to produce a uniform layer of silicon nitride to insulate the substrate. These processes tend to produce a very thick film of silicon nitride, and consequently require very long deposition cycles, typically 3 to 8 hours. As a result, a lot of powder is generated as a by-product of this process. Such by-products include complex ammonium-chloro-silicate salts, for example, ammonium hexasilicate, which sublimes at 120° C. at atmospheric pressure.

As these materials enter the inlet of a wet scrubber they cool, and can agglomerate and react with water vapour back streaming from the wet scrubber. For example, ammonium hexasilicate can form a glass like deposit lining the inlet of the wet scrubber. If deposit build-up is allowed to continue uninterrupted, it can completely block the inlet, incurring down time and loss of production. For instance, most process tool manufacturers (OEMs) mechanically clean the process chamber off-line, which allows the solid deposits to build up uninterrupted.

SUMMARY OF THE INVENTION

In a first aspect, the present invention provides apparatus for reducing clogging of a pipe, the apparatus comprising a body having an open end adapted to be detachably connected to an aperture of the pipe, a shaft moveable within and relative to the body, a scraping device attached to one end of the shaft, means for reciprocally moving the shaft to urge the scraping device into the pipe to dislodge particulates deposited within the pipe and to withdraw the scraping device from the pipe, and, extending about the body, means for injecting heated, compressed gas into the body to inhibit particulate deposition therein.

Preferably, the moving means comprises a piston attached to the other end of the shaft, the piston being reciprocally moveable within a cylinder. A variety of pneumatic cylinders 60 are commercially available (for example, single or double acting, with or without spring return, with fixed or rotating shaft), all of which could he used. A preferred embodiment uses a double acting pneumatic cylinder with a rotating shaft, magnetic piston, and cushioned end stops. Benefits of the double acting actuator without a spring return are that it can be driven into the retracted position and can easily overcome the forces exerted on the scraper by the incoming process gases, there is no loss of force during extension or retraction, and the rotating shaft enables the helical coil to cut through very hard deposits.

As mentioned above, the apparatus finds particular use in cleaning an inlet pipe to a wet scrubber or other abatement device, and so in a second aspect the present invention provides apparatus for reducing clogging of an inlet pipe to a wet scrubber, the apparatus comprising a body having an open end adapted to be detachably connected about an aperture of the inlet pipe, a shaft moveable within and relative to the body, a scraping device attached to one end of the shaft, means for reciprocally moving the shaft to urge the scraping device into the inlet pipe to dislodge particulates deposited within the pipe and to withdraw the scraping device from the inlet pipe, and, extending about the body, means for injecting heated, compressed gas into the body to inhibit particulate deposition therein.

In a third aspect, the present invention provides a method of reducing clogging of a pipe, the method comprising detachably connecting to an aperture of the pipe an attachment comprising a body, a shaft moveable within and relative to the body, and a scraping device attached to one end of the shaft; reciprocally moving the is shaft to urge the scraping device into the pipe to dislodge particulates deposited within the pipe and to withdraw the scraping device from the pipe; and injecting heated, compressed gas into the body to inhibit particulate deposition therein.

In a fourth aspect, the present invention provides a method of reducing clogging of an inlet pipe to a wet scrubber, the method comprising detachably connecting to an aperture of the inlet pipe an attachment comprising a body, a shaft moveable within and relative to the body, and a scraping device attached to one end of the shaft; reciprocally moving the shaft to urge the scraping device into the inlet pipe to dislodge particulates deposited within the pipe and to withdraw the scraping device from the inlet pipe; and injecting heated, compressed gas into the body to inhibit particulate deposition therein.

Features described above in relation to apparatus aspects of the invention are equally applicable to method aspects of the invention, and vice versa.

BRIEF DESCRIPTION OF THE DRAWINGS

Preferred features of the present invention will now be described with reference to the accompanying drawings, in which.

DETAILED DESCRIPTION OF THE INVENTION

Figure 1:
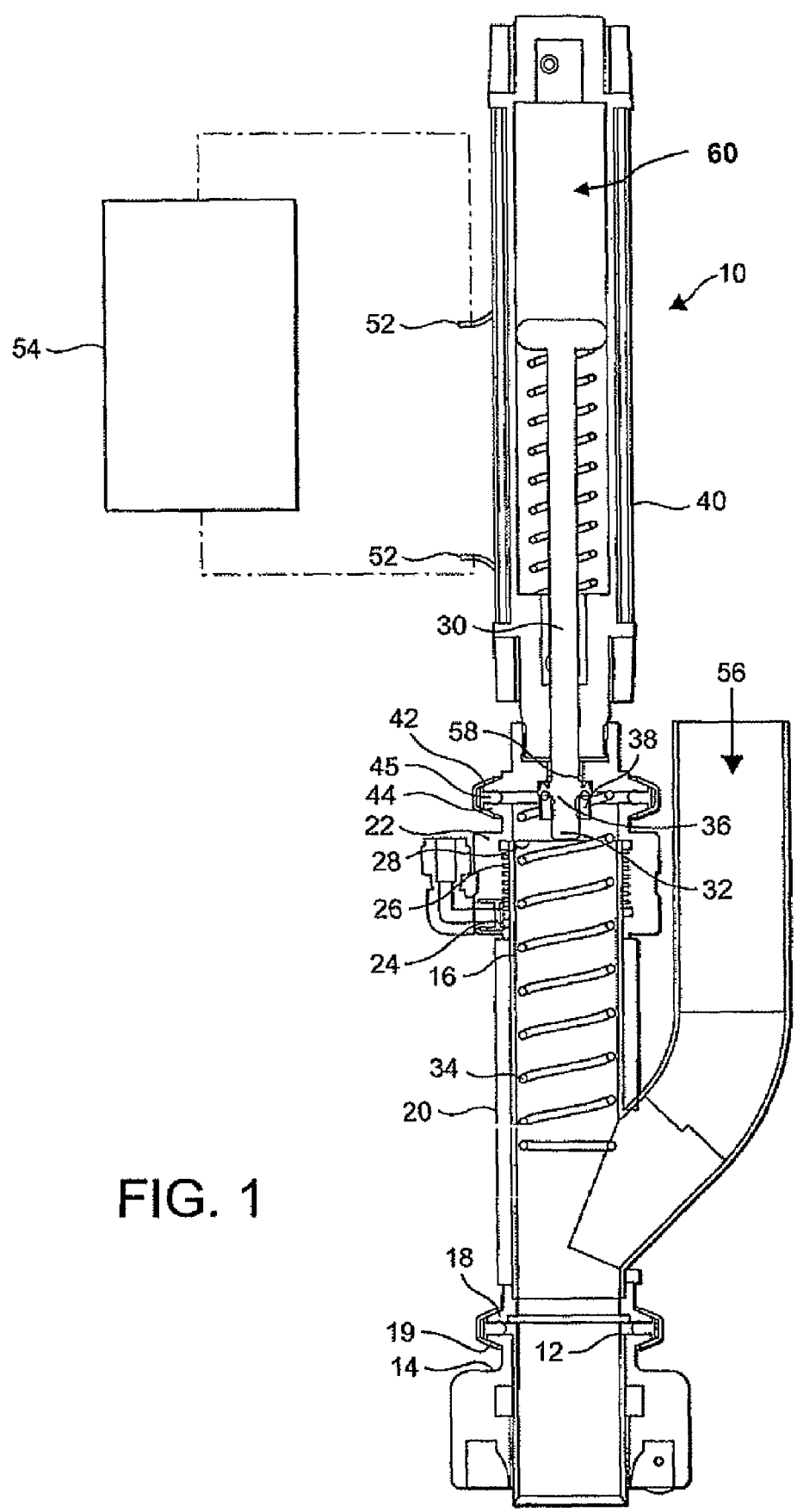
FIG. 1 illustrates a cross-section through an example of an apparatus for reducing clogging of an inlet pipe to a wet scrubber.

In a first aspect, the present invention provides apparatus for reducing clogging of a pipe, the apparatus comprising a body having an open end adapted to be detachably connected to an aperture of the pipe, a shaft moveable within and relative to the body, a scraping device attached to one end of the shaft, means for reciprocally moving the shaft to urge the scraping device into the pipe to dislodge particulates deposited within the pipe and to withdraw the scraping device from the pipe, and, extending about the body, means for injecting heated, compressed gas into the body to inhibit particulate deposition therein.

Thus, the invention can ensure that the piped interface between, for example, the exhaust of a process tool and the inlet to a wet scrubber or other device remains substantially free from obstruction. This can increase the availability of the process tool, reducing maintenance and operating costs.

Introducing into the body a hot gas purge at a temperature preferably in the range from 50 to 200° C., most preferably in the range from 80 to 120° C., can increase the partial pressure of the water vapour back-streaming from the wet scrubber, thereby reducing the risk of condensation within the body. This is because any condensed water vapour would form a cold spot and promote the deposition of materials within the body. Furthermore, the outer surface of the scraping device can be kept hot and dry, and an inert atmosphere can be maintained within the body.

In principle, any compressed gas may be used. Two commonly available gases are clean dry air (CDA) and nitrogen. Nitrogen is preferred because it will not react with the chemical species typically present in the pipe, unlike the oxygen present in CDA; oxygen will react with silicon hydrides to form solid deposits, for example silane, di-chloro-silane and tri-chloro-silane.

Preferably, the injecting means comprises one or more orifices for injecting the purge gas into the body, preferably in such a manner so as to minimise the risk of forming eddy currents within the body; such eddy currents can promote solid formation.

The apparatus preferably comprises heating means extending about the body for maintaining the temperature thereat within the range from 50 to 200° C., preferably within the range from 80 to 150° C. This can also assist in preventing a "cold finger" from entering the body and accelerating the rate of deposition.

The mechanical scraper may be, in principle, any mechanical device that dislodges particulates from the walls of the pipe as it is moved therein. However, if the scraper was rigid, tough deposits could deform the scraper and damage the shaft. Therefore, a preferred embodiment is a helical coil, due to its innate flexibility and multiple surfaces for removing tough deposits. The coil may take any convenient form, although the greater the number of coils passing any one section of the pipe as the coil is moved therein, the higher the removal efficiency. For instance, the preferred embodiment uses a helical coil with a pitch of around 18 mm, and a length of over 110 mm. The scraping device is preferably formed from a chemically inert and mechanically stable solid material, such as stainless steel.

Preferably, the moving means comprises a piston attached to the other end of the shaft, the piston being reciprocally moveable within a cylinder. A variety of pneumatic cylinders 60 are commercially available (for example, single or double acting, with or without spring return, with fixed or rotating shaft), all of which could he used. A preferred embodiment uses a double acting pneumatic cylinder with a rotating shaft, magnetic piston, and cushioned end stops. Benefits of the double acting actuator without a spring return are that it can be driven into the retracted position and can easily overcome the forces exerted on the scraper by the incoming process gases, there is no loss of force during extension or retraction, and the rotating shaft enables the helical coil to cut through very hard deposits.

The magnetic piston enables position indicators, such as reed switches, to validate the cylinder's position (extended or retracted), and feed this information back to the control system to ensure that the apparatus is performing optimally.

Providing pneumatically cushioned end stops can prevent damage to the ends of the actuator shaft. The actuator shaft should have sufficient mechanical strength to prevent bowing or other mechanical damage. In the preferred embodiment, a solid 12 mm diameter stainless steel shaft is used, although in principle the shaft may be formed from any convenient size or material.

In the preferred embodiment, the actuator stroke is sufficient to clean the end of the inlet pipe without the end of the scraper becoming wetted by scrubber liquid, and to at least substantially fully retract the scraping device from the gas stream passing through the inlet pipe. Thus, the scraping device is preferably at least partially, most preferably substantially contained within the body when the shaft is in a fully retracted position. If the scraper were left in the gas stream it could act as a catalyst to pipe blockage. For example, strokes of 120 and 250 mm are used in different embodiments of the invention.

Pneumatic pressure selection is another important factor. The actuator should supply sufficient force to remove hard and stubborn deposits without damaging other delicate components. Theoretically any positive pressure is acceptable, for example 0-10 bar gauge, although in practice 2-4 bar gauge has been found to be sufficient.

During normal operation, solid material can build up on the actuator shaft as the scraper is moved into the (cooler) pipe. The apparatus therefore preferably comprises means for preventing particulates deposited on the shaft from being drawn into the moving means as the shaft is withdrawn from the pipe. For example, the apparatus may comprise scraping means, such as an annular seal through which the shaft passes, for scraping particulates from the shaft during movement thereof. Without an additional scraper seal these deposits could be dragged back through actuator nose seal. In principle any seal material could be used; to date we have found PEEK™ (poly-ether-ether-ketone) to be the most efficient material for minimising shaft abrasion whilst withstanding the elevated operating temperatures.

As mentioned above, the apparatus finds particular use in cleaning an inlet pipe to a wet scrubber or other abatement device, and so in a second aspect the present invention provides apparatus for reducing clogging of an inlet pipe to a wet scrubber, the apparatus comprising a body having an open end adapted to be detachably connected about an aperture of the inlet pipe, a shaft moveable within and relative to the body, a scraping device attached to one end of the shaft, means for reciprocally moving the shaft to urge the scraping device into the inlet pipe to dislodge particulates deposited within the pipe and to withdraw the scraping device from the inlet pipe, and, extending about the body, means for injecting heated, compressed gas into the body to inhibit particulate deposition therein.

In a third aspect, the present invention provides a method of reducing clogging of a pipe, the method comprising detachably connecting to an aperture of the pipe an attachment comprising a body, a shaft moveable within and relative to the body, and a scraping device attached to one end of the shaft; reciprocally moving the shaft to urge the scraping device into the pipe to dislodge particulates deposited within the pipe and to withdraw the scraping device from the pipe; and injecting heated, compressed gas into the body to inhibit particulate deposition therein.

In a fourth aspect, the present invention provides a method of reducing clogging of an inlet pipe to a wet scrubber, the method comprising detachably connecting to an aperture of the inlet pipe an attachment comprising a body, a shaft moveable within and relative to the body, and a scraping device attached to one end of the shaft; reciprocally moving the shaft to urge the scraping device into the inlet pipe to dislodge particulates deposited within the pipe and to withdraw the scraping device from the inlet pipe; and injecting heated, compressed gas into the body to inhibit particulate deposition therein.

As illustrated in FIG. 1, the apparatus is in the form of an attachment 10 to a flanged end 12 of a pipe inlet 14 to a wet scrubber, although the attachment 10 could be attached to an end of any other pipe that requires frequent unblocking. The attachment 10 comprises a sleeve 16 having a flanged open end 18 detachably connectable by any suitable means to the flanged end 12 of the pipe 14. For example, as illustrated an NW system 19 may be used, which comprises a centre ring containing an O-ring, and a clamp to hold the flanges together. Such a fitting can provide full control of the orientation of the sleeve 16 relative to the pipe inlet 14. Alternatively, one or more bolts may be used to connect the sleeve 16 to the pipe inlet 14. The pipe inlet 14 is preferably formed from plastics material that has high thermal stability in the range from 80 to 250° C., most preferably in the range from 120 to 170° C. Suitable materials include, but are not limited to, polypropylene, polytetrafluorethylene, polysulphone, polyethersulphone, polyetherimide and polyvinyl difluoride.

A heater 20 extends about the outside of the sleeve 16 to maintain the temperature within the sleeve 16, in use, within the range from 50 to 200° C., preferably within the range from 80 to 150° C.

A cylindrical flanged fitting 22 is provided at the other end of the sleeve 16. The fitting 22 is provided with a nozzle 24 for receiving a stream of hot, compressed purge gas, such as nitrogen or clean dry air, typically injected at a rate of 2 to 10 slpm from a source thereof (not shown). The gas is injected at a temperature in the range of 50 to 200° C., preferably in the range from 80 to 120° C. The nozzle 24 is in fluid communication with a helical channel 26 located about the internal bore of the fitting 22. Purge gas is received at the base of the channel 26, and spirals up the channel 26 on the outside of the sleeve 16. At the top of the channel 26, the purge gas enters the sleeve 16 through one or more orifices 28 formed in the sleeve 16. A plurality of orifices 28 may be spaced circumferentially about the sleeve 16, although any suitable number (that is, one or more) of orifices may be provided as required.

Creating a hot, dry inert environment within the sleeve can minimise the likelihood of particulate deposition within the sleeve. Gas injection also increases the partial pressure of any water vapour back-streaming from the wet scrubber, thereby reducing the risk of condensation within the sleeve and also preventing deposition of particulates within the sleeve.

Due to the elevated temperature of the purge gas passing through the channel 26 formed in the fitting 22, the fitting 22 is preferably formed from PEEK™ (poly-ether-ether-ketone) so that the rate of transfer of heat from the purge gas to the fitting is relatively low. This reduces both thermal losses in the purge gas and the temperature of the external surface of the fitting 22.

The bore of the fitting 22 receives a moveable, stainless steel actuator shaft 30. Attached to one end 32 of the shaft 30 is a scraper 34 in the form of a stainless steel helical coil. For example, as illustrated in FIG. 1, one end of the coil can be clamped between a flanged portion 36 of the shaft 30 and a nut 38 threaded on to the end 32 of the shaft 30.

The shaft 30 forms part of a pneumatic cylinder 40 provided for moving the scraper 36 relative to the sleeve 16. The cylinder 40 is provided with a flanged end 42 provided with a bore through which the shaft 30 passes. The flanged end 42 of the cylinder 40 is attached to a flanged end 44 of the fitting 22 by any suitable means. For example, as illustrated an NW system 45 may be used, which comprises a centre ring containing an O-ring, and a clamp to hold the flanges together. Alternatively, one or more bolts may be used to connect the cylinder 40 to the fitting 42.

Figure 2:
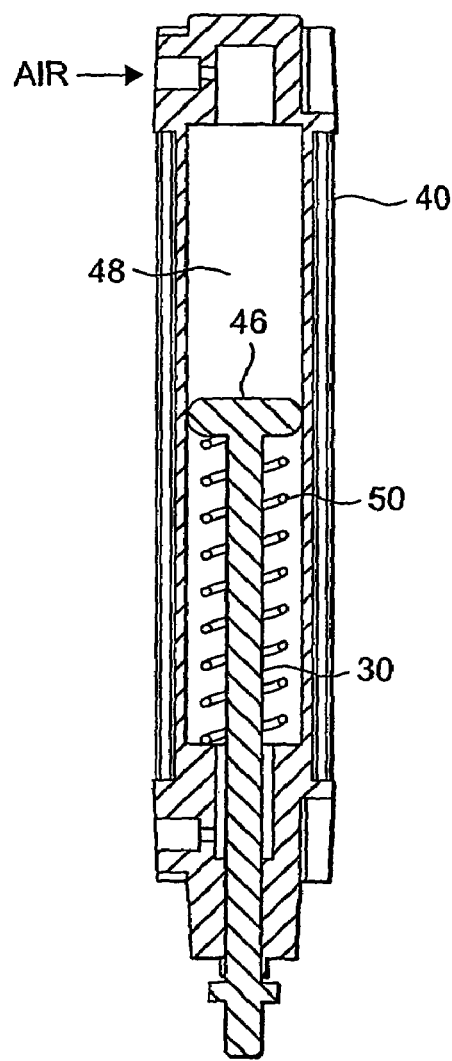
FIG. 2 illustrates a cross-section of one example of a pneumatic cylinder for moving the scraper of the apparatus shown in FIG. 1.
Figure 3:
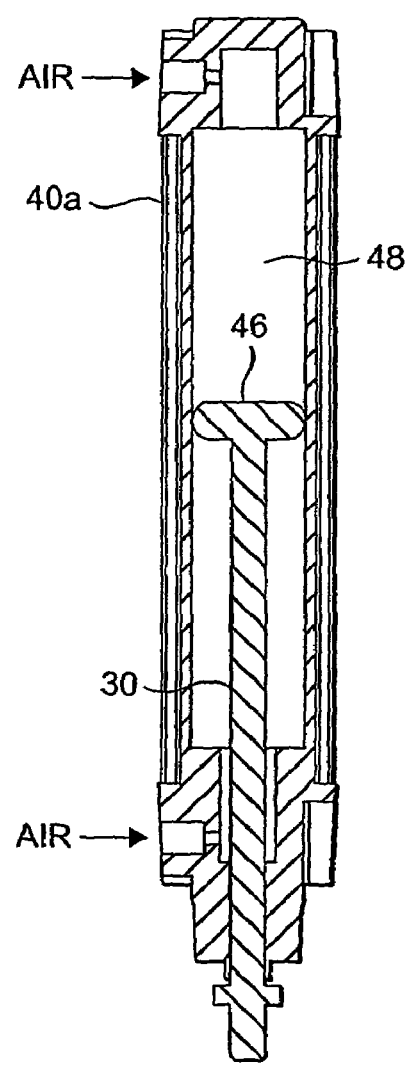
FIG. 3 illustrates a cross-section of another example of a pneumatic cylinder for moving the scraper of the apparatus shown in FIG. 1.
Figure 4:
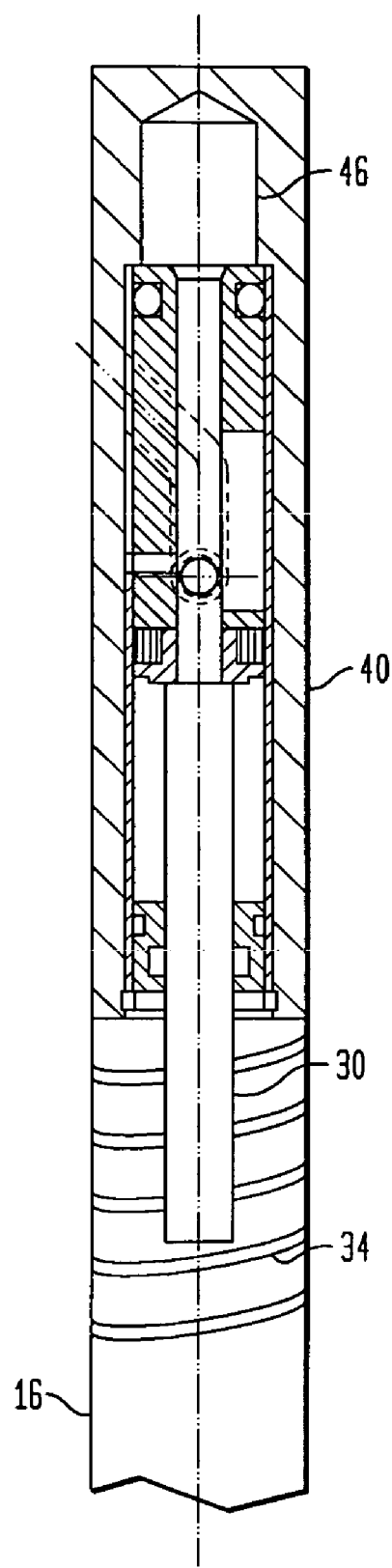
FIG. 4 illustrates a cross-section of another example of a pneumatic cylinder having a rotating shaft for moving the scraper of the apparatus shown in FIG. 1.

As is well known, the pneumatic cylinder 40 comprises a piston 46 moveable within a cylindrical chamber 48 under the pressure of compressed air injected into the chamber 48. The other end of the actuator shaft 30 is connected to the piston 46. In the example shown in FIGS. 1 and 2, the pneumatic cylinder 40 is a single acting pneumatic cylinder with a return spring 50. Compressed air or nitrogen is injected into the chamber 48 to urge the piston 46 downwards (as illustrated) against the force of the spring 50, and thus cause the shaft 30 to move to urge the scraper 34 towards the inlet pipe 14. When the air pressure is removed, the spring 50 urges the piston 46 back to the rest position, thus moving the shaft 30 upwards (as illustrated) to the retracted position shown in FIG. 1. In the example shown in FIG. 3, the pneumatic cylinder 40a is a double acting cylinder. Compressed air or nitrogen into the pneumatic cylinder is injected into the chamber 48 on the upper (as illustrated) side of the piston 46 to urge the piston 46 downwards (as illustrated) towards the inlet pipe 14, and compressed air or nitrogen is injected into the chamber 48 on the opposite side of the piston to urge the piston away from the inlet pipe 14.

Where the pneumatic cylinder 40 includes a magnetic piston, for example, where a double acting pneumatic cylinder is used, FIG. 1 illustrates that reed switches 52 may provided on the outside of the pneumatic cylinder 40 to generate signals indicative of the position of the magnetic piston within the pneumatic cylinder for supply to a control system 54 for controlling operation of the pneumatic cylinder 40.

In use, the control system 54 operates the pneumatic cylinder 40 to reciprocally move the shaft 30 to urge the scraper 34 into the inlet pipe 14 to dislodge particulates deposited within the inlet pipe 14 and to withdraw the coil from the inlet pipe 14 back into the sleeve 16, away from process gases, indicated at 56, flowing from a process tool into the inlet pipe 14. The attachment can be operated either at a regular "preprogrammed" timer (ranging from every 30 seconds to a weekly event; optimum every 3 hours) or from a remote trigger. The frequency of operation can be optimised with respect to the deposition rate inside the pipe inlet 14, mechanical damage to the shaft 30 and scraper 34, and build up of deposits on the end of the scraping mechanism.

During actuation, solid deposits can build up on the scraper 34, which could temporarily block the pipe leading to loss of production. This can be eliminated if the mechanical clean only happens when the process tool is idle. As shown in FIG. 1, an annular PEEK™ scraper seal 58 can be provided in the bore of the flanged end of the pneumatic cylinder 40 to scrape particulates from the surface of the (moving) actuator shaft 30.

Pneumatic valves may control the actuator operation. Multiple configurations are available.

In summary, an attachment for an inlet pipe to a wet scrubber or other device comprises a sleeve having an open end adapted to be detachably connected to a flanged end of the inlet pipe. A shaft is moveable within the sleeve, and a scraper is attached to one end of the shaft. The shaft forms part of a pneumatic cylinder attached to the other end of the sleeve. In use, the shaft is reciprocally moved to cause the scraper to dislodge particulates deposited within the pipe. Heated gas such as nitrogen or dry air is injected into the sleeve to prevent scrubbing liquid from condensing within the sleeve and thus inhibit particulate deposition therein.

As mentioned above, although the invention has been described with reference to its use in cleaning an interior surface of a pipe inlet to a wet scrubber, it can be used to clean any suitable surface in an abatement device or other system that is prone to particulates being undesirably deposited by a process gas.

In addition to semiconductor processing systems, the device can be used as part of other types of chemical processing systems in which there are surfaces prone to chemical particulates being deposited by a process gas.

In connection with the wet scrubber inlet, semiconductor metal etch processes can produce aluminum chloride as a by-product. Aluminum chloride itself reacts very rapidly with water to produce a solid by-product (aluminum oxide(s)) and an acid gas (hydrogen chloride). Controlling the interface between wet and dry is critical to prevent solid build-up and liquid acids. The concentrated acidic solutions, in time, will corrode any metal pipe work resulting in loss of production and an increase in overheads. Again, a hot gas purge will prevent the water vapour condensing and liquid pools from forming.

Polyvinyl chloride (PVC) has been the material of choice for wet scrubber inlets, because of its chemical, machining and welding properties. Unfortunately, PVC mechanical strength seriously deteriorates above 60° C. With the introduction of heaters to raise the gas temperature above 60° C., manufactures have had to add cooling circuits to reduce the inlet temperature. This increases the machining and operating costs. In a single fault condition, loss of cooling will thermally stress and damage the inlet. This can result in the machine being forced to shut down which in turn increases the operating cost of the unit.

Using plastics with higher thermal stability (melting points), typically in the range from 80 to 250° C., preferably in the range from 120 to 170° C., removes the need for this cooling channel and enables the inlet to function at significantly higher temperatures, reducing the rate of deposition and increasing the time between maintenances. For example, the body may be formed from one of polypropylene, polytetrafluorethylene, polysulphone, polyethersulphone, polyetherimide and polyvinyl difluoride.

We claim:

1. An apparatus for reducing clogging of a pipe, the apparatus comprising a body having an open end adapted to be detachably connected to an aperture of the pipe, a shaft moveable within the body, a scraper attached to one end of the shaft, means for reciprocally moving the shaft to urge the scraper into the pipe to dislodge particulates deposited within the pipe and to withdraw the scraper from the pipe, and injecting means on the body for injecting heated compressed gas into the body to inhibit particulate deposition, wherein the scraper is a helical coil that is flexible in a longitudinal direction of the body.

2. The apparatus according to claim 1 wherein the injecting means comprises an orifice located on an inner surface of the body.

3. The apparatus according to claim 1 comprising heating means extending about the body for maintaining the temperature within the body within the range from 50 to 200° C.

4. The apparatus according to claim 1 wherein the scraper has an open construction.

5. The apparatus according to claim 1 wherein the scraper is formed from stainless steel.

6. The apparatus according to claim 1, wherein the means for reciprocally moving comprises a piston reciprocally moveable within a cylinder, and the piston being attached to a second end of the shaft.

7. The apparatus according to claim 1 wherein the means for reciprocally moving is arranged to rotate the shaft so as to rotate the scraper within the pipe.

8. The apparatus according to claim 1 having a first position wherein the scraper is fully withdrawn from the pipe and is substantially contained within the body so as not to be exposed to gases within the pipe.

9. The apparatus according to claim 1 comprising scraping means for scraping particulates from the shaft during movement thereof.

10. The apparatus according to claim 9 wherein the scraping means comprises an annular seal through which the shaft passes.

11. The apparatus according to claim 1 comprising heating means extending about the body for maintaining the temperature within the body within the range from 80 to 150° C.

12. The apparatus according to claim 1 wherein the injecting means comprises a helical channel for directing the compressed gas about the body.

13. An apparatus for reducing clogging of an inlet pipe to a wet scrubber, the apparatus comprising:
    a body having an open end adapted to be detachably connected about an aperture of the inlet pipe;
    a shaft moveable within the body;
    a scraper attached to one end of the shaft;
    a double acting pneumatic cylinder to reciprocally move and rotate the shaft to urge the scraper into the inlet pipe to dislodge particulates deposited within the pipe and to withdraw the scraper from the inlet pipe; and
    injecting means on the body for injecting heated compressed gas into the body to inhibit particulate deposition,
    wherein the scraper is a helical coil that is flexible in a longitudinal direction of the body.

14. The apparatus according to claim 13 wherein the injecting means comprises a helical channel for directing the compressed gas about the body.

* * * * *